United States Patent

Casciotti

Patent Number: 4,969,824
Date of Patent: Nov. 13, 1990

[54] ELECTRICAL CONNECTOR

[75] Inventor: Albert Casciotti, Hershey, Pa.

[73] Assignee: AMP Incorporated, Harrisburg, Pa.

[21] Appl. No.: 539,274

[22] Filed: Jun. 8, 1990

Related U.S. Application Data

[63] Continuation of Ser. No. 387,269, Jul. 28, 1989, abandoned.

[51] Int. Cl.$^5$ .............................................. H05K 1/00
[52] U.S. Cl. ...................................... 439/62; 439/65; 439/67; 439/637
[58] Field of Search ...................... 439/55, 65, 66, 67, 439/77, 492–499, 630–637, 840

[56] References Cited

U.S. PATENT DOCUMENTS

| | | | |
|---|---|---|---|
| 3,614,707 | 10/1971 | Kaufmann et al. | 439/67 |
| 4,087,148 | 5/1978 | Bauerle | 439/635 |
| 4,227,767 | 10/1980 | Mouissie | 339/176 |
| 4,552,420 | 11/1985 | Eigenbrode | 439/67 |
| 4,626,056 | 12/1986 | Andrews, Jr. et al. | 339/75 |
| 4,629,270 | 12/1986 | Andrews, Jr. et al. | 339/75 |

Primary Examiner—David L. Pirlot
Attorney, Agent, or Firm—Allan B. Osborne

[57] ABSTRACT

A card edge connector with flexible printed circuit film. More particularly a card edge connector for electrically interconnecting circuits on two circuit boards through flexible printed circuit film mounted in the connector and with the contact pads thereon being biased outwardly by coil springs behind the contact pads.

28 Claims, 5 Drawing Sheets

ELECTRICAL CONNECTOR

This application is a continuation of application Ser. No. 07/387,269 filed July 28, 1989, now abandoned.

FIELD OF THE INVENTION

The present invention relates to electrical connectors which are mounted on a back panel and which receive therein a daughter circuit card so that the circuits on the panel and card may be electrically interconnected. More particularly, the invention relates to the use of flexible printed circuit film strips in the connector to provide the electrical paths.

BACKGROUND OF THE INVENTION

The use of flexible printed circuit film strips for electrical paths in card edge connectors is well known and is exemplified in U.S. Pat. Nos. 4,227,767, 4,626,056 and 4,629,270. The latter two patents disclose connectors having camming mechanisms which push the contacts on the film strips against the contacts on the daughter card after the card has been inserted. The former patent teaches the use of leaf-like springs on each side of the card slot which are positioned behind the flexible printed circuit film strip and provide the normal force between the contacts on the film and inserted daughter card. It is now proposed to provide a card edge connector wherein the flexible printed circuit film strips are pushed against the daughter card by elongated coil springs.

SUMMARY OF THE INVENTION

According to the invention a card edge connector is provided having circuits on flexible film strips therein to provide electrical paths. The connector includes a housing which have grooves along surfaces facing the card receiving slot and on the base surfaces on each side of the slot. Elongated coil springs are positioned in the grooves under the film strips to provide the normal force between the contact pads on the strips and on the back panel on which the connector is mounted and on the circuit card which is received in the slot.

DESCRIPTION OF THE INVENTION

Figure 1:
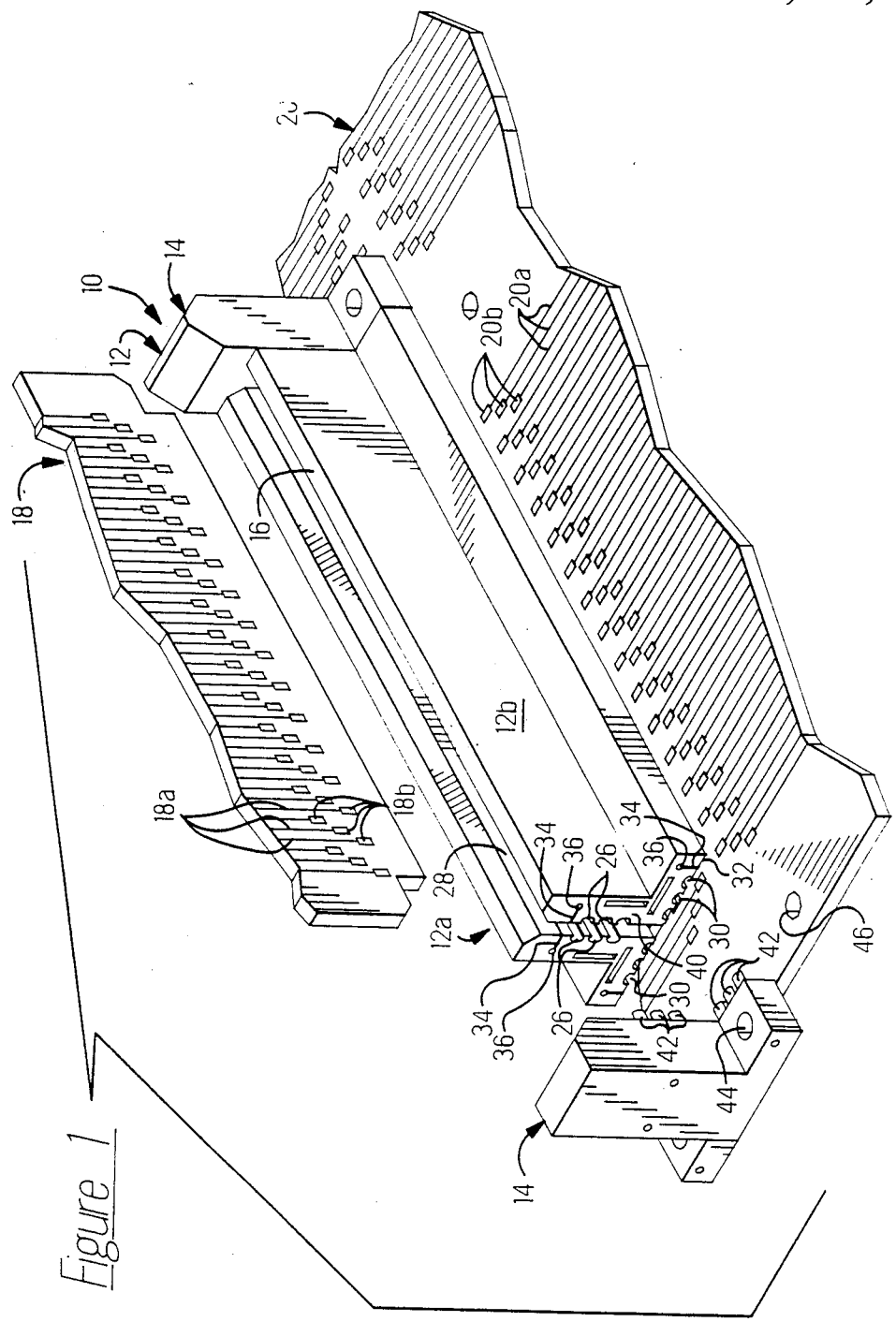
FIG. 1 is a perspective view showing the card edge connector of the present invention but without the flexible printed circuit film and coil springs.
Figure 3:
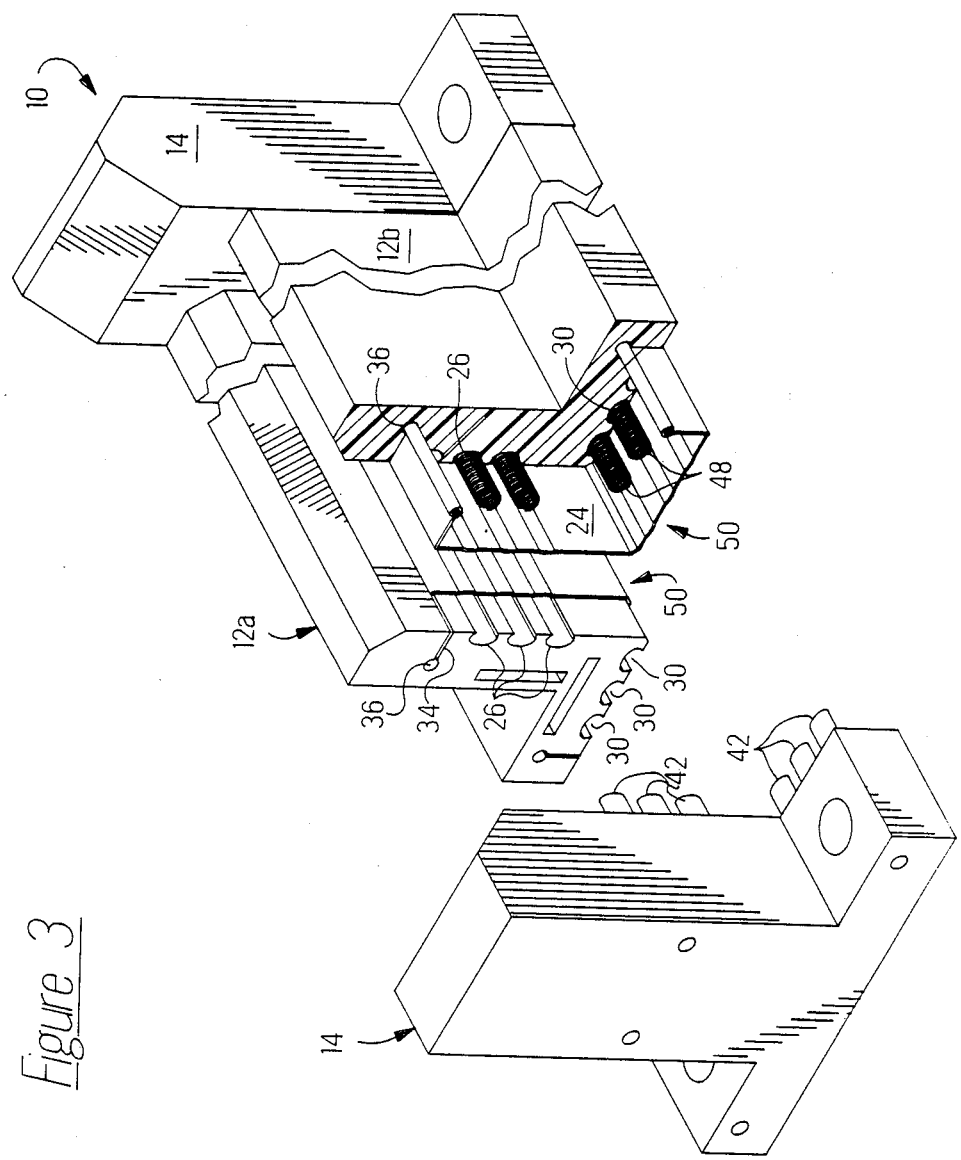
FIG. 3 is the same view as FIG. 1 but with the film and springs in the connector.
Figure 4:
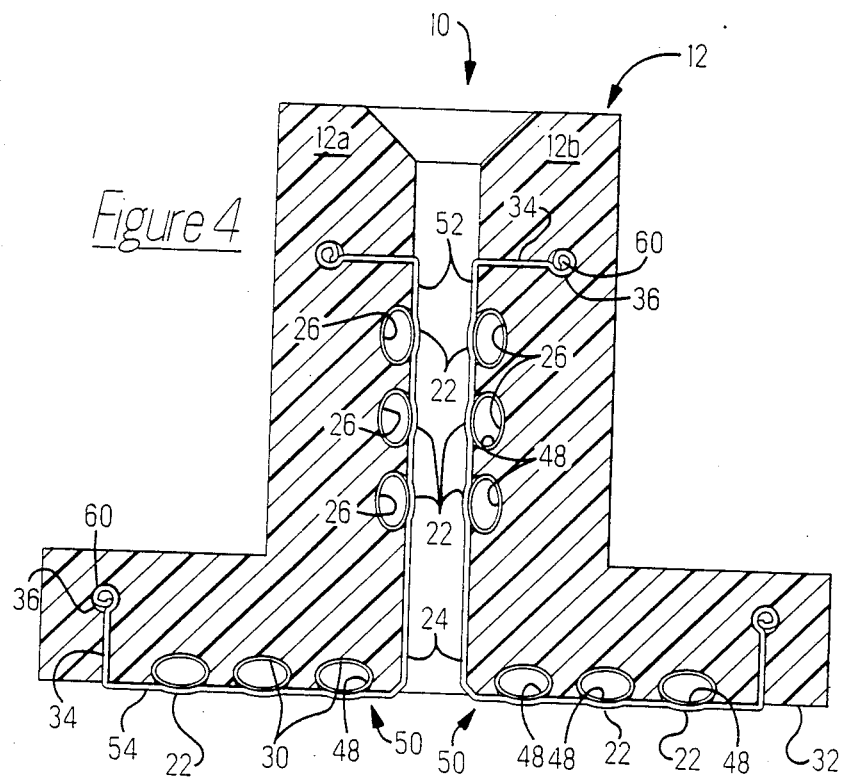
FIG. 4 is a side end view of the card edge connector shown in FIG. 3.

Card edge connector 10 as shown in FIG. 1 includes half housings 12a, 12b which are identical. The two half housings 12a, 12b are joined by end blocks 14 to form a complete housing 12 having card slot 16 extending longitudinally between the blocks 14. Slot 16 receives an edge of daughter card 18 shown thereabove. An assembled connector 10 is mounted on back panel 20 so that circuits 18a on card 18 may be electrically connected to panel circuits 20a through circuit contact pads 22 and traces (not shown) on flexible printed circuit film strips 24 (FIG. 2) which is part of connector 10 as shown in FIGS. 3 and 4.

Each half housing 12a, 12b is provided with a set of elliptical shaped grooves 26 on inside surfaces 28 and grooves 30 on base surface 32. Each set of grooves 26, 30 extend along the length of each half housing 12a, 12b and may include any number. The three grooves per set shown is for illustrational purposes only. Note the grooves 26, 30 are truncated along the surfaces 28 and 32 respectively. Slits 34, located adjacent the outermost groove 26, 30 terminates in circular cavities 36. Slits 34 and cavities 36 also run the length of half housings 12a, 12b.

End blocks 14 carry outwardly projecting elliptical-shaped fingers 42 which are frictionally received in grooves 26, 30 to hold half housings 12a, 12b together to form a completed housing 12. Blocks 14 may also include cooperating means to hold connector 10 on panel 20. In the illustrated embodiment, holes 44 cooperate with holes 46 in panel 20 to receive fastening members such as nuts and bolts (not shown).

Half housings 12a, 12b are molded or extruded and end blocks 14 are molded from a suitable dielectric material such as a polyester; e.g. such as sold by General Electric under the trademark "VALOX".

Figure 2:
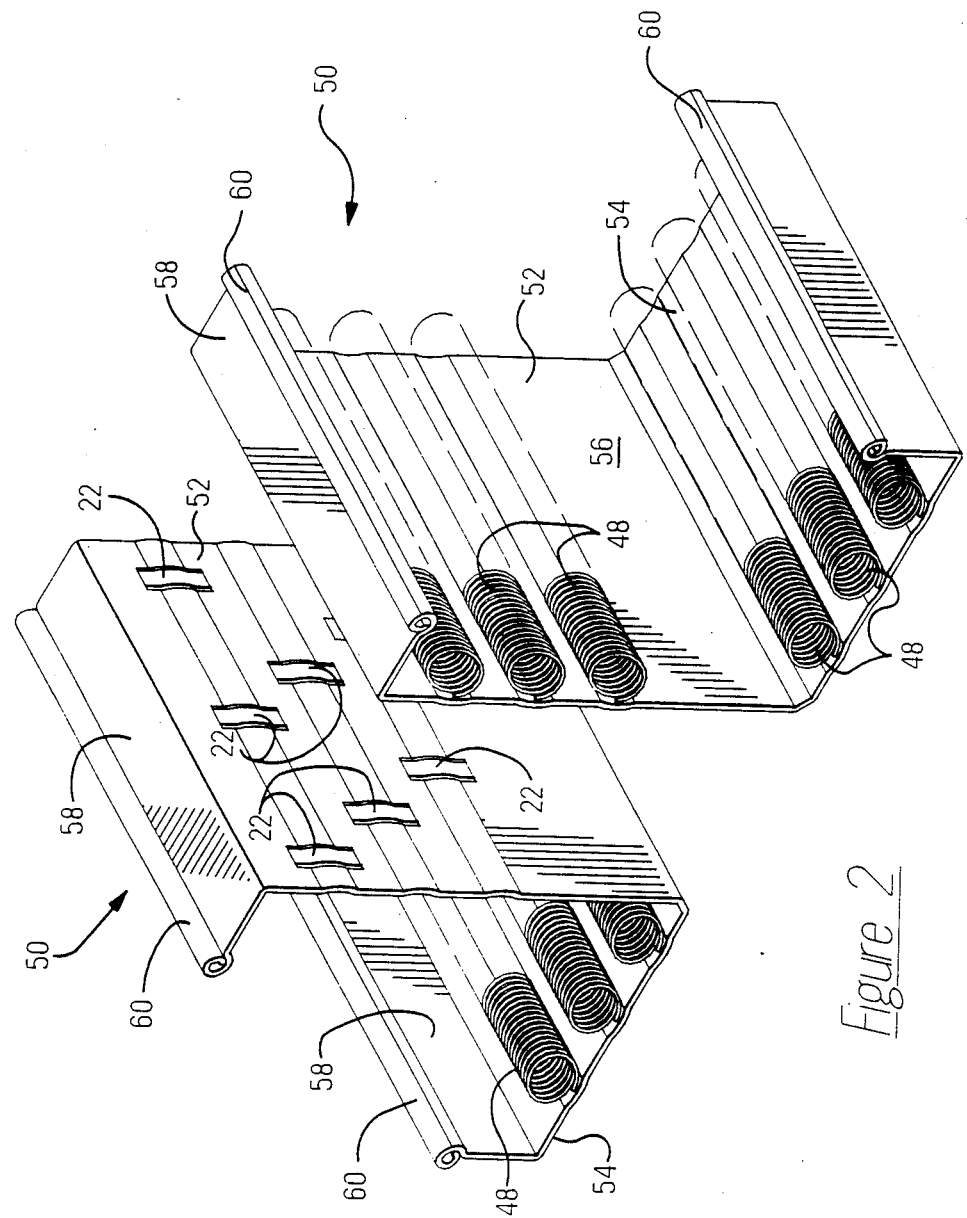
FIG. 2 is a perspective view of the flexible printed circuit film and coil springs which are carried by the connector shown in FIG. 1.

FIG. 2 shows flexible printed circuit film strips 24 and coil springs 48 associated therewith, forming sub-unit 50. Film strips 24 may be multi-layered to achieve varying electrical characteristics and includes rows of contact pads 22 on respective legs 52, 54 and conductive traces (not shown) extending therebetween. Added to back surfaces 56 are elongated canted coil springs 48, one or more springs 48 being generally behind each row of contact pads 22. Springs 48 may be free or attached to film strips 24 by a suitable adhesive such as a General Electric two-component silicon based adhesive #529.

Free ends 58 of strips 24, which are bent at right angles to respective legs 52, 54 include rolls 60. Rolls 60 are preferably non-resilient; e.g., a rigid rod (not shown) may be provided in each roll 60 similar to the rod on a window shade (not shown).

Canted coil springs 48 are preferred and are made and sold by the Bal Seal Engineering Company Inc. of Santa Ana, Calif. and are illustrated in its catalog 3.1. These springs have a high degree of deflection with the force remaining nearly constant over the working range of deflection due to being canted.

The assembly of connector 10 begins with loading sub-units 50 into half housings 12a, 12b. Working from either free end face 40, free ends 58 and rolls 60 are fed into slits 34 and cavities 36 respectively and slid down the length of the respective half housing 12a, 12b. Provided of course that the respective dimensions of the sub-units 50 and half housings 12a, 12b are correct, coil springs 48 will automatically follow along in respective grooves 26, 30. FIGS. 3 and 4 show sub-units 50 properly loaded in the respective half housings 12a, 12b. Note that springs 48 protrude outwardly from respective grooves 26, 30 so that contact pads 22 are biased outwardly.

The final step is to attached end blocks 14 by pushing fingers 42 into grooves 26, 30 on end faces 40. This results in securing the two half housings 12a, 12b together to form housing 12, provides card slot 16, and centers sub-units 50 longitudinally.

Connector 10 may now be bolted or otherwise fixed to back panel 20 with contact pads 22 on legs 54 pressing against contact pads 20b (FIG. 1) to establish electrical contact therebetween. Upon inserting daughter card 18 into card slot 16 of connector 10, contact pads 22 on legs 52 will engage and press against contact pads 18b to establish electrical contact therebetween and with circuits 20a on panel 20 through the traces (not shown) in film 24.

The normal force being exerted by the canted coil springs 48 results from the springs being resiliently deformed at a slant; i.e., in the direction of the cant with the deformation causing wipe between the respective contact pads 18b, 20b and 22. Further, the deformation need not be uniform along the spring length but can and will vary depending on out of tolerance conditions of the card 18, panel 20 and film strips 24. In any event, the deformation is such that the contact pads 18b, 20b and 22 experience a relatively constant normal force over a large range of deflection.

Figure 5:
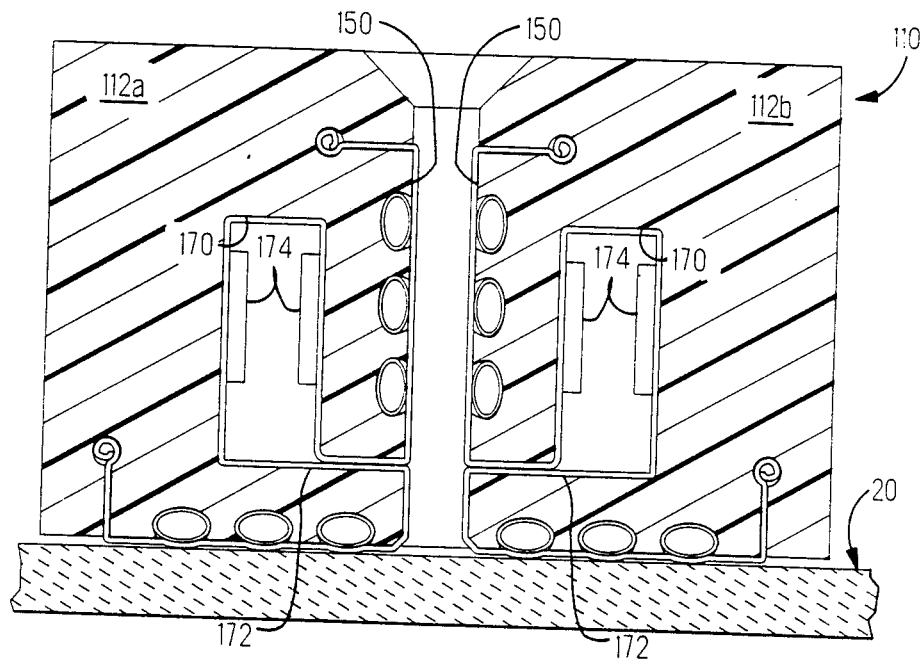
FIG. 5 is an end view of a second embodiment of the card edge connector.

Connector 110 shown in FIG. 5 is very similar to connector 10 except for the addition of longitudinal rectangular cavities 170 and slits 172 leading to them in each half housing 112a, 112b. Sub-units 150 are made wider and electronic components 174 e.g., integrated circuit packages, mounted thereon for being received in cavities 170 as shown.

Figure 6A:
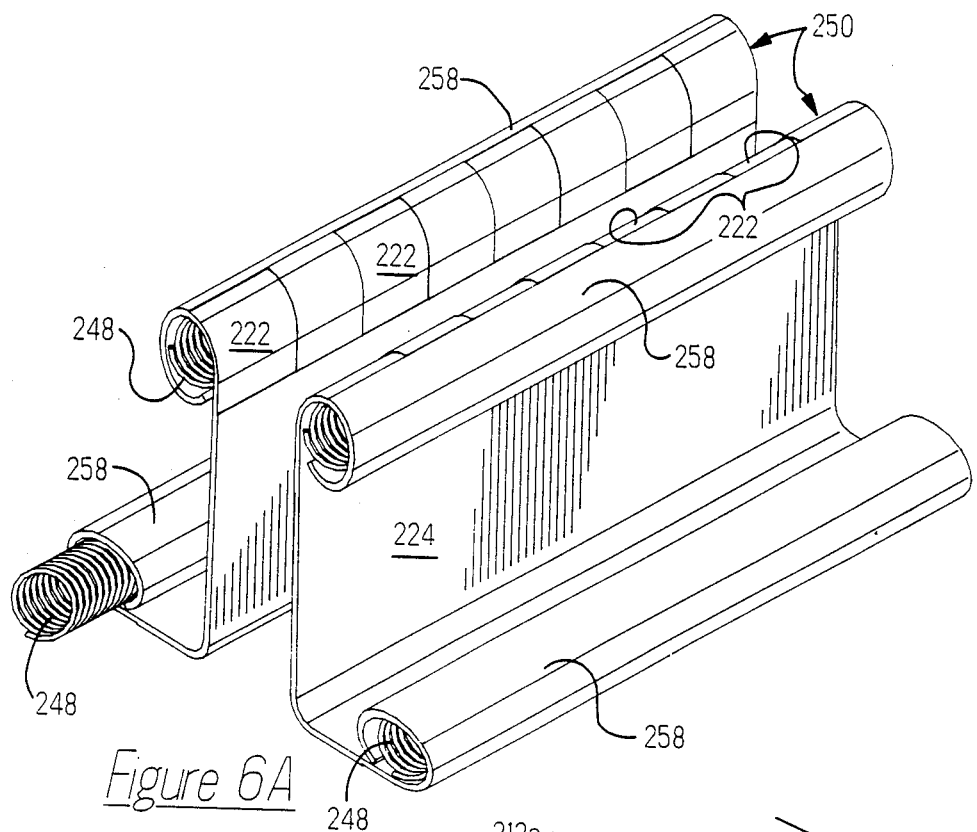
FIG. 6A and 6B are perspective views of another embodiment of a flexible printed circuit film and coil springs and housing therefore.

FIG. 6A shows sub-units 250 wherein film strips 224 has a single row of contact pads 222 at free ends 258 which are rolled over canted coil springs 248.

Figure 6B:
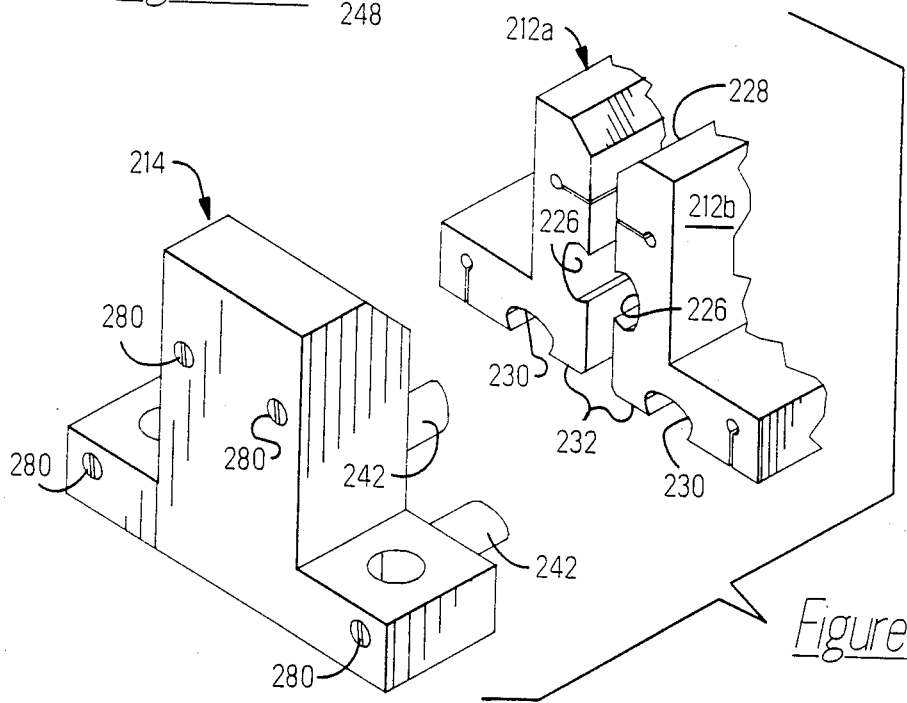

As shown in FIG. 6B, half housings 212a and 212b are provided with a single arcuate groove 226 on inside surface 228 and groove 230 on base surface 232 to receive rolled free ends 258. End blocks 214 have also been modified by replacing fingers 42 with appropriate-shaped pegs 242 which enter respective grooves 226, 230. Blocks 214 may be frictionally held to half housings 212a, 212b or by other conventional means; e.g., screws, latches and the like. An important feature of the design of connector 210 is that pegs 242 may be made to move in or out by circuit alignment screws 280 and thereby shift sub-units 250 longitudinally in respective grooves 226, 230 to provide precise alignment between contact pads on a back panel and daughter card (not shown) and 222.

Some of the features and benefits of the present invention include simple designs which are economically made, components which may be replaced individually and a relatively constant contact normal force over a large deflection range.

The present invention contemplates the use of canted coil springs for the reason that such springs offer a near constant force over a large range of deflection. However, non-canted, elongated coil springs may also be used and such use is intended to be within the scope and spirit of the present invention and the attached claims.

At the present time the embodiments shown represent the preferred mode. By providing half housings 12a, 12b and end blocks 14, assembly and disassembly is very simple. However, housing 12 may be one piece. This would require different loading techniques; e.g., one end block could be removable to provide access to the grooves. More complicated procedures might also be developed. However, such and other modifications not noted here which will become readily apparent to workers in the field are intended to be within the scope and spirit of the present invention and the claims attached hereto.

Reference has been made herein to back panels and daughter circuit cards. However, connector 10 and other embodiments thereof are intended to be used with any type substrate be it a back panel, mother board, printed circuit boards and so forth.

As can be discerned, a card edge connector having flexible printed circuit film therein has been disclosed. The connector includes half housings which receive sub-units of the circuit film with elongated coil springs mounted on the back surface in registration with contact pads on the front surface. The connector is formed by attaching end blocks to join the half housings which have been loaded with the sub-units. The springs provide a near constant normal force between the contact pads on the film and respective contact pads on a back panel on which the connector is mounted and daughter card which is received in a slot between the joined half housings.

I claim:

1. An electrical connector comprising:
   a housing of suitable dielectric material and having a longitudinal slot extending therethrough from a top surface to a base surface and thereby defining a pair of facing surfaces and a pair of base surfaces, each of said facing and base surfaces having elongated receiving means thereon;
   elongated coil spring means positioned in said elongated receiving means; and
   flexible printed circuit film strips having spaced apart rows of contact pads on a front surface, said strips attached to said housing and extending over at least a portion of respective facing and base surfaces with said rows of contact pads facing and biased outwardly by said spring means.

2. The connector of claim 1 wherein said coil springs are attached to a back surface of said film strips and in registration with said rows of contact pads on said front surface.

3. The connector of claim 1 wherein said elongated receiving means include grooves in said facing surfaces and in said base surfaces for receiving said spring means.

4. The connector of claim 1 wherein said elongated receiving means include grooves in said facing surfaces and in said base surfaces for receiving said coil springs.

5. The connector of claim 1 wherein said elongated coil spring means include canted coil springs.

6. The connector of claim 5 wherein said canted coil springs are attached to a back surface of said film strips and in registration with said rows of contact pads on said front surface.

7. The connector of claim 5 wherein said elongated receiving means include grooves in said facing and base surfaces for receiving said canted coil springs.

8. An electrical connector comprising:
   a non-conductive housing having a longitudinal slot extending therethrough, said slot being between a pair of facing surfaces and opening out between a pair of base surfaces with said facing surfaces being perpendicular to said base surfaces, said housing further having longitudinally extending grooves in said facing and base surfaces;
   elongated coil spring means positioned in said grooves; and
   a pair of flexible printed circuit film strips having a plurality of rows of contact pads extending longitudinally on a front surface, said film strips being attached to said housing and extending over said springs in said grooves in respective facing and base surfaces with said coil spring means being behind and biasing respective rows of contact pads outwardly.

9. The connector of claim 8 wherein said coil spring means include canted coil springs.

10. An electrical connector, comprising:
a non-conductive housing having a longitudinal slot extending therethrough and thereby defining a pair of laterally facing surfaces and a pair of outwardly facing base surfaces, said housing further having longitudinal receiving means in said facing and base surfaces; and
a pair of sub-units comprising flexible printed circuit film strips with rows of contact pads on a front surface and elongated coil spring means on a back surface with each spring means being in registration with a respective row of contact pads, each sub-units being removably attached to said housing on a respective side of said slot and extending over at least a portion of said facing and base surfaces with said elongated spring means being received in said longitudinal receiving means.

11. The connector of claim 10 wherein said longitudinal receiving means include grooves.

12. The connector of claim 10 wherein said longitudinal receiving means include grooves and said spring means include elongated canted coil springs.

13. The connector of claim 12 wherein said housing includes two half housings and further including means to removably secure said half housings together.

14. The connector of claim 13 wherein said means to removably secure said half housings together include end blocks.

15. The connector of claim 14 further including movable means mounted in said end blocks and extending into said grooves to move said sub-units longitudinally.

16. The connector of claim 15 wherein said movable means include screw actuated pegs.

17. An electrical connector comprising:
a pair of half housings of a suitable dielectric material with each having a lateral surface and, perpendicular thereto, a base surface, and further having grooves extending longitudinally along said lateral and base surfaces;
coil springs disposed in said grooves;
flexible printed circuit film strips having spaced apart longitudinal rows of contact pads on a front surface, said strips attached to respective half housings and extending over said coil springs in said grooves in said lateral and base surfaces with said coil springs biasing said rows of contact pads outwardly; and
joining means joining said half housings together with said lateral surfaces spaced from and facing each other and said base surfaces facing outwardly in the same direction.

18. The connector of claim 17 wherein said spring included canted coil springs.

19. An electrical connector, comprising:
a pair of non-conductive half housings with each having a lateral surface and, perpendicular thereto, a base surface and further having grooves extending longitudinally along respective lateral and base surfaces;
a pair of sub-units comprising flexible printed circuit film strips and a plurality of coil springs, said film strips having a plurality of rows of contact pads on a front surface and said coil springs attached to a back surface behind respective rows of contact pads, said sub-units attached to respective half housings with said rows of contact pads facing outwardly and said coil springs disposed in said grooves in said lateral and base surfaces; and
end blocks for joining said half housings together with said lateral surfaces spaced from and facing each other and with said base surfaces being coplanar.

20. The connector of claim 19 wherein said coil springs are canted.

21. The connector of claim 19 wherein said end blocks include adjusting means for shifting said sub-units longitudinally.

22. The connector of claim 21 wherein said adjusting means include screw actuated, reciprocally moving pegs extending into said grooves.

23. The connector of claim 22 wherein said coil springs are canted.

24. An electrical connector comprising:
a housing having two surfaces with said two surfaces being on different planes;
a flexible circuit film strip having interconnected conductive areas, said strip being attached to said housing with said conductive areas covering at least portions of said two surfaces; and
coil spring means positioned between respective said conductive areas and respective said two surfaces for biasing said conductive areas outwardly.

25. The electrical connector of claim 24 wherein said two surfaces include receiving means for receiving said coil spring means.

26. The electrical connector of claim 25 wherein said receiving means include grooves.

27. An electrical connector comprising:
a housing having first and second surfaces;
a flexible circuit film strip having spaced-apart, electrically-interconnected conductive areas accessible on one surface of said film strip, said film strip being positioned on said housing, with said conductive areas covering a portion of respective first and second surfaces; and
coil springs positioned between said conductive areas and respective said first and second surfaces to bias said conductive areas outwardly.

28. The electrical connector of claim 27 wherein said coil springs are canted coil springs.

* * * * *

Disclaimer

4,969,824—*Albert Casciotti*, Hershey, Pa. ELECTRICAL CONNECTOR. Patent dated Nov. 13, 1990. Disclaimer filed May 10, 1991, by the assignee, AMP Inc.

Hereby enters this disclaimer to claims 1-23 of said patent.
[ *Official Gazette August 27, 1991* ]